United States Patent
Kishikawa et al.

(10) Patent No.: US 12,243,972 B2
(45) Date of Patent: Mar. 4, 2025

(54) LIGHT EMITTING DEVICE

(71) Applicant: NICHIA CORPORATION, Anan (JP)

(72) Inventors: Daisuke Kishikawa, Anan (JP);
Takaaki Tada, Itano-gun (JP);
Tomohisa Toda, Tokushima (JP);
Naoki Ishida, Anan (JP); Yoshiki Endo, Tokushima (JP)

(73) Assignee: NICHIA CORPORATION, Anan (JP)

( * ) Notice: Subject to any disclaimer, the term of this patent is extended or adjusted under 35 U.S.C. 154(b) by 470 days.

(21) Appl. No.: 17/724,139

(22) Filed: Apr. 19, 2022

(65) Prior Publication Data

US 2022/0336722 A1    Oct. 20, 2022

(30) Foreign Application Priority Data

Apr. 20, 2021   (JP) ................................. 2021-071348

(51) Int. Cl.
*H01L 21/00* (2006.01)
*H01L 33/48* (2010.01)
*H01L 33/56* (2010.01)
*H01L 33/62* (2010.01)

(52) U.S. Cl.
CPC ............ *H01L 33/62* (2013.01); *H01L 33/486* (2013.01); *H01L 33/56* (2013.01)

(58) Field of Classification Search
CPC ........ H01L 33/62; H01L 33/486; H01L 33/56
See application file for complete search history.

(56) References Cited

U.S. PATENT DOCUMENTS

| | | |
|---|---|---|
| 2007/0004080 A1 | 1/2007 | Ouyang |
| 2009/0001487 A1 | 1/2009 | Mizuno et al. |
| 2010/0167002 A1 | 7/2010 | Chu et al. |
| 2012/0049225 A1 | 3/2012 | Wakaki |
| 2012/0326178 A1 | 12/2012 | Fehrer et al. |
| 2015/0023026 A1 | 1/2015 | Sakamoto et al. |
| 2019/0096778 A1 | 3/2019 | Oka et al. |
| 2019/0324359 A1 | 10/2019 | Shimizu et al. |

(Continued)

FOREIGN PATENT DOCUMENTS

| | | |
|---|---|---|
| CN | 110389492 A | 10/2019 |
| CN | 111276588 A | 6/2020 |

(Continued)

*Primary Examiner* — Richard A Booth
(74) *Attorney, Agent, or Firm* — Foley & Lardner LLP

(57) ABSTRACT

A light emitting device includes: a base having an upper face; a light emitting element mounted on the upper face of the base; one or more bonding members disposed on the upper face of the base outward of the light emitting element; a light transmissive member bonded to a portion of the upper face of the base by the one or more bonding members; and a protective film that continuously covers the light emitting element, the upper face of the base, lateral faces of the one or more bonding members, and a lower face of the light transmissive member. A gap is located between the upper face of the base and the lower face of the light transmissive member and configured to allow a space in which the light emitting element is mounted to communicate with an outside of the light emitting device, wherein the gap is defined by the upper face of the base, the lower face of the light transmissive member, and the one or more bonding members.

7 Claims, 6 Drawing Sheets

(56) References Cited

U.S. PATENT DOCUMENTS

| | | |
|---|---|---|
| 2020/0185569 A1 | 6/2020 | Cheng et al. |
| 2020/0287092 A1* | 9/2020 | Ishida ................... H01L 33/62 |
| 2023/0100081 A1* | 3/2023 | Kususe ................ G02B 5/0242 |
| | | 359/599 |

FOREIGN PATENT DOCUMENTS

| | | |
|---|---|---|
| JP | H05-048361 U | 6/1993 |
| JP | 2009-016383 A | 1/2009 |
| JP | 2009-500848 A | 1/2009 |
| JP | 2012-069539 A | 4/2012 |
| JP | 2012-513665 A | 6/2012 |
| JP | 2013-514642 A | 4/2013 |
| JP | 2015-023081 A | 2/2015 |
| JP | 2016-066798 A | 4/2016 |
| JP | 2016-127056 A | 7/2016 |
| JP | 2018-006456 A | 1/2018 |
| JP | 2018-056263 A | 4/2018 |
| JP | 2019-191320 A | 10/2019 |
| JP | 2020-092265 A | 6/2020 |
| JP | 2020-145390 A | 9/2020 |

\* cited by examiner

LIGHT EMITTING DEVICE

CROSS-REFERENCE TO RELATED APPLICATIONS

The present application claims priority to Japanese Application No. 2021-071348, filed on Apr. 20, 2021, which is hereby incorporated by reference in its entirety.

BACKGROUND

The present disclosure relates to a light emitting device.

Japanese Patent Publication No. 2018-6456 describes a light emitting device that includes a package, a light emitting element disposed in the package, a bonding member disposed on the upper face of the package, and a light transmissive member bonded to the upper face of the package by the bonding member.

SUMMARY

There is a need to further improve the reliability of such a light emitting device. The present disclosure can provide a highly reliable light emitting device.

A light emitting device according to one embodiment of the present disclosure includes a base having an upper face, a light emitting element mounted on the upper face of the base, a bonding member disposed on the upper face of the base outward of the light emitting element, a light transmissive member bonded to a portion of the upper face of the base by the bonding member, and a protective film covering the upper face of the base and the light emitting element, wherein the light emitting device has a gap between the upper face of the base and the lower face of the light transmissive member that allows the space in which the light emitting element is mounted to be in communication with the outside of the light emitting device that is defined by the upper face of the base, the lower face of the light transmissive member, and the bonding member, and the protective film continuously covers the light emitting element, the upper face of the base, the lateral faces of the bonding member, and the lower face of the light transmissive member.

According to embodiments of the present disclosure, a highly reliable light emitting device can be provided.

DETAILED DESCRIPTION

Figure 1:
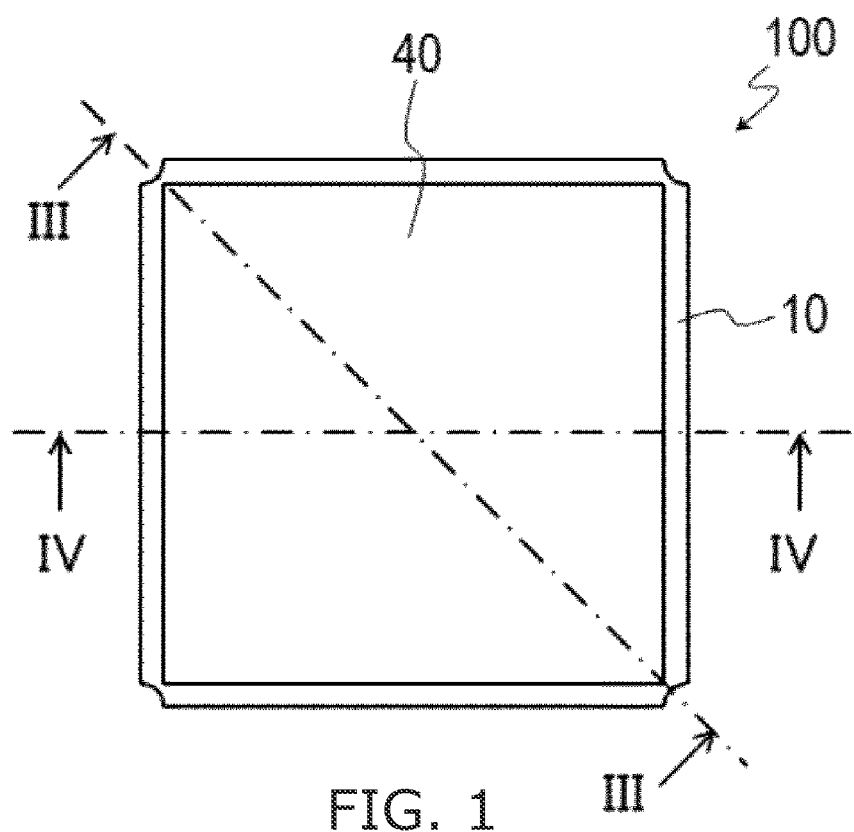
FIG. 1 is a schematic upper face view of a light emitting device according to Embodiment 1.

Certain embodiments of the present invention will be explained below with reference to the accompanying drawings. The embodiments explained below are provided for the purpose of giving shape to the technical ideas of the present invention, which do not limit the present invention unless otherwise specifically noted. The sizes of and positional relationships between the members shown in the drawings might be exaggerated for clarity of explanation.

The present invention will be explained in detail below based on the drawings. In the explanation below, terms indicating specific directions or positions (e.g., "upper," "lower," or terms including these words) will be used as needed. These terms are used to make the embodiments in the drawings more easily understood, and the meaning of such terms does not restrict the technical scope of the present invention. The members or parts denoted by the same reference numerals are the same or equivalent members or parts.

Furthermore, the embodiments described below are backlights shown as examples for the purpose of embodying the technical ideas of the present invention. However, the present invention is not limited to the examples described below. The dimensions, materials, shapes, and relative positions of the constituent elements described below are not meant to limit the scope of the invention unless otherwise specifically noted, but are intended to provide examples. The content described with reference to one embodiment or example is applicable to another embodiment or example. Moreover, the sizes of and positional relationships between the members shown in the drawings might be exaggerated for clarity of explanation.

Embodiment 1

Figure 2:
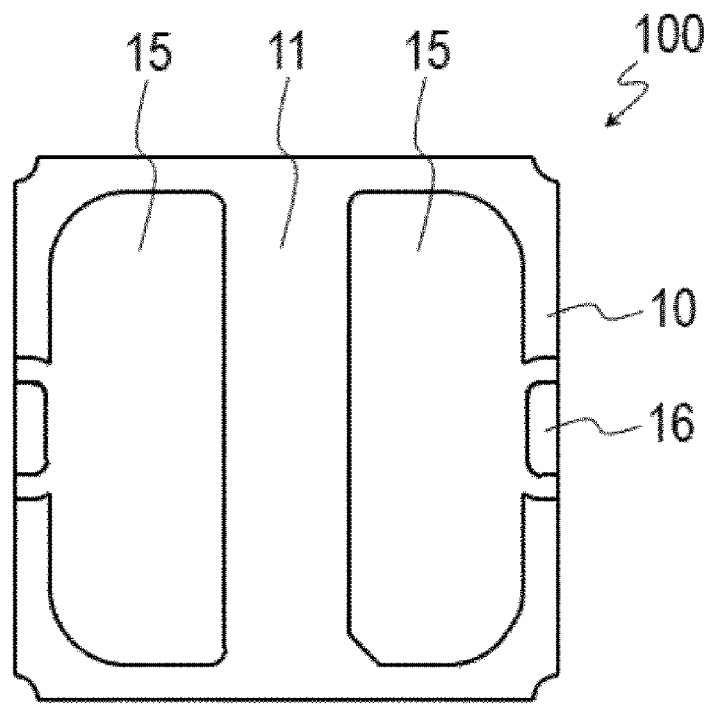
FIG. 2 is a schematic lower face view of the light emitting device according to Embodiment 1.
Figure 3:
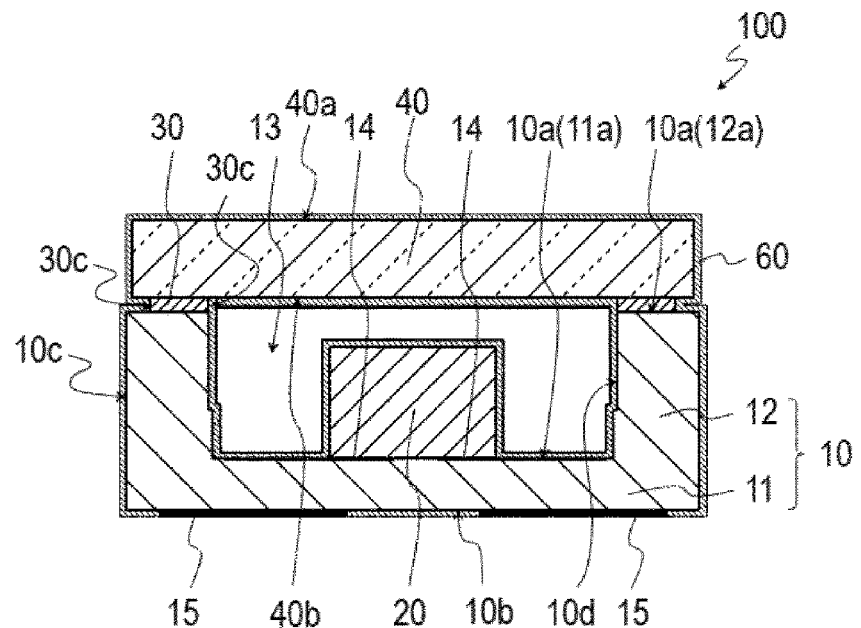
FIG. 3 is a schematic cross-sectional view taken along line in FIG. 1.
Figure 4:
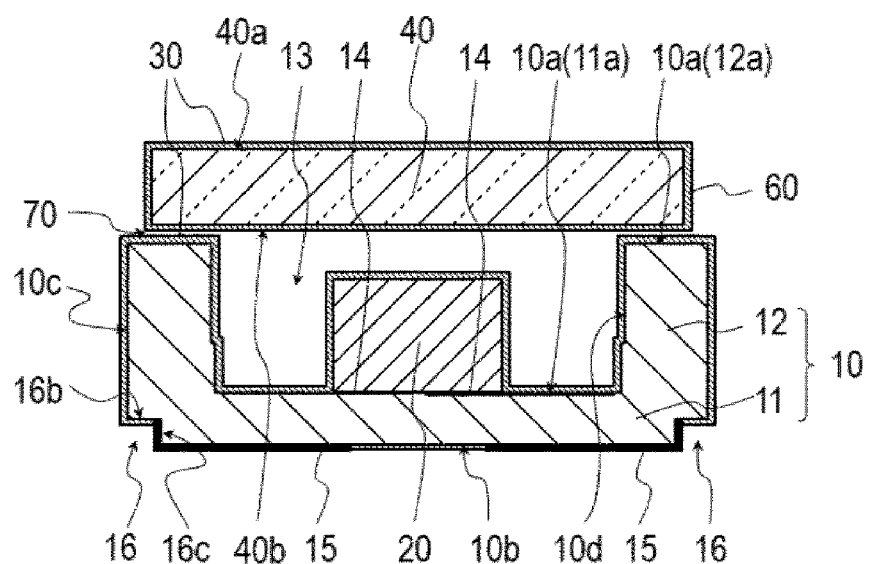
FIG. 4 is a schematic end face view, showing only the cross section along line IV-IV in FIG. 1.
Figure 5:
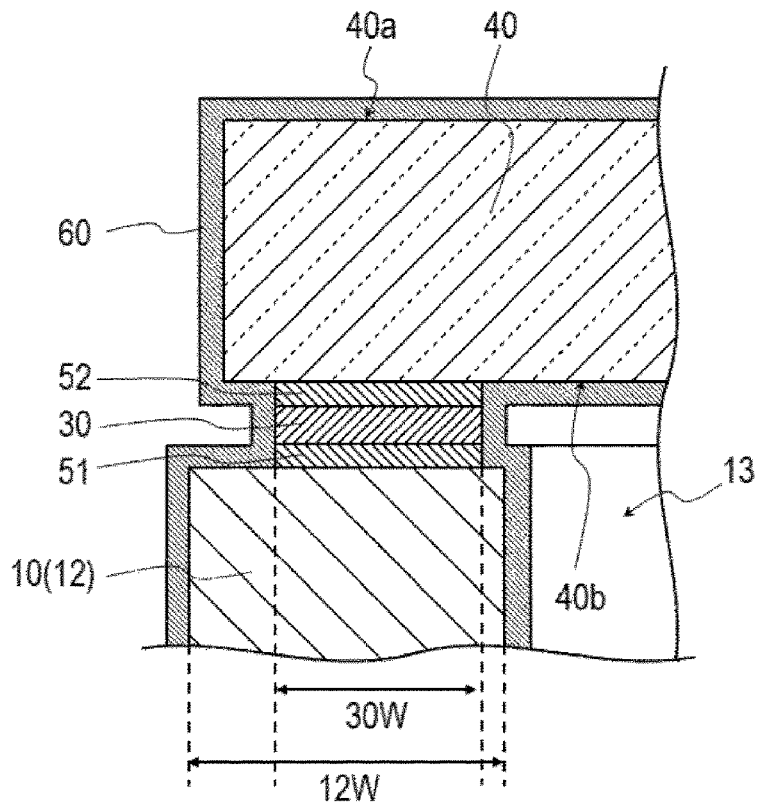
FIG. 5 is a schematic cross-sectional view, enlarging a portion of the bonding member and the vicinity thereof in the light emitting device according to Embodiment 1.

FIG. 1 is a schematic upper face view of a light emitting device according to Embodiment 1. FIG. 2 is a schematic lower face view of the light emitting device of the embodiment. FIG. 3 is a schematic cross-sectional view taken along line in FIG. 1. FIG. 4 is a schematic end face view only showing the cross section along line IV-IV in FIG. 1. FIG. 5 is a schematic cross-sectional view enlarging a portion of the bonding member and the vicinity thereof in the light emitting device according to the embodiment.

The light emitting device 100 shown in FIG. 3 includes a base 10 having an upper face 10a, a light emitting element 20 mounted on the upper face 10a, bonding members 30 disposed on the upper face 10a outward of the light emitting element 20, a light transmissive member 40 bonded to a portion of the upper face 10a by the bonding members 30, and a protective film 60 covering the upper face 10a of the base 10 and the light emitting element 20. The device has, between the upper face 10a of the base 10 and the lower face 40b of the light transmissive member 40, gaps 70 that allow the space in which the light emitting element 20 is mounted to be in communication with the outside of the light emitting device 100. The gaps 70 are defined by the upper face 10a of the base 10, the lower face 40b of the light transmissive member 40, and the bonding members 30. The protective film 60 continuously covers the light emitting element 20, the upper face 10a of the base 10, the lateral faces 30c of the bonding members 30, and the lower face 40b of the light transmissive member 40.

Figure 6:
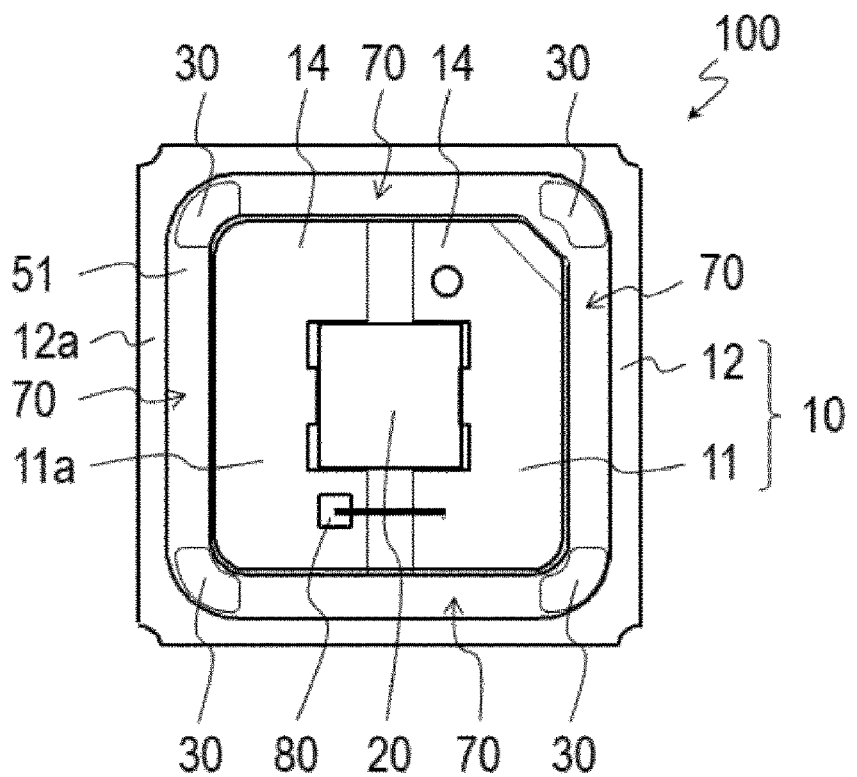
FIG. 6 is a schematic upper face view showing the layout of bonding members.

In the example shown in FIG. 1, the base 10 has a flat sheet-shaped base part 11, and a lateral wall part 12 disposed on the base part 11. The base part 11 and the lateral wall part 12 may be formed integrally, or as separate parts. The base part 11 and the lateral wall part 12 define a first recessed part. The first upper face 11a of the base part 11 is the bottom of the first recessed part. The light emitting element 20 is disposed on the first upper face 11a. The shape of the first upper face 11a when viewed from above is quadrangular, for example. As shown in FIG. 6, the second upper face 12a, which is the upper face of the lateral wall part 12, is positioned outward of the light emitting element 20 when viewed from above. The second upper face 12a is frame shaped having, for example, a quadrangular outline when viewed from above.

Positive and negative first wires 14 are arranged on the first upper face 11a of the base 10. The light emitting element 20 is flip-chip mounted on the base 10. Specifically, using a light emitting element 20 having positive and negative electrodes on the same face, the positive and negative electrodes of the light emitting element 20 are electrically connected to the positive and negative first wires 14 of the base 10, respectively, via conductive members. For the conductive members, for example, (i) eutectic solder using gold and tin, or tin, silver, and copper as main components, (ii) conductive paste containing silver, gold, or palladium, or (iii) bumps containing silver or gold can be used. The light emitting element 20 may be connected to the first wires 14 of the base 10 using wires (mounted face up). Second wires 15 are arranged on the lower face 10b of the base 10. The base part 11 of the base 10 has through holes, and internal wires (not shown) are disposed in the through holes. The first wires 14 and the second wires 15 are connected using the internal wires. The base 10 may or may not have second recessed parts 16 on the lower face 10b side. The second recessed parts 16 are provided from the lower face 10b to the outer lateral faces 10c of the base 10. In the case in which second recessed parts 16 are provided, the second wires 15 are also disposed on the outer lateral faces 16c of the base 10 that define the second recessed parts 16. When bonding the second wires 15 of the light emitting device 100 to another mounting substrate or the like by using solder or the like, the solder can enter the second recessed part 16. This can electrically connect the second wires 15 in a more stable manner.

A light transmissive member 40 is a member having light transmissivity that transmits at least the light from the light emitting element 20, transmitting at least 60%, preferably at least 90% of the emitted light from the light emitting element 20. The shape of the light transmissive member 40 is, for example, quadrangular when viewed from above. The light transmissive member 40, besides the flat sheet shape shown in FIG. 1 and FIG. 2, may be such that the upper face and/or the lower face are/is spherical or aspherical lens shaped.

A bonding member 30 bonds the second upper face 12a of the lateral wall part 12 of the base 10 and the light transmissive member 40. Because the lateral wall part 12 is disposed to surround the light emitting element 20 when viewed from above, the bonding member 30 is preferably disposed to surround the light emitting element 20 as well. The bonding member 30 is disposed on a portion of the second upper face 12a, not across the entire surface, of the base 10. In the portions in which the bonding members 30 are not disposed, as shown in FIG. 4, there are gaps 70 between the second upper face 12a of the base 10 and the lower face of the light transmissive member 40 that are defined by the second upper face 12a of the base 10, the lower face 40b of the light transmissive member 40, and the bonding members 30. The gaps 70 allow the space in which the light emitting element 20 is disposed to be in communication with the outside of the light emitting device 100. In other words, the space in which the light emitting element 20 is disposed is not an airtight space in the light emitting device 100.

In the example shown in FIG. 6, a plurality of bonding members 30 are arranged. The bonding members 30 are disposed at the four corners of the second upper face 12a that is quadrangular when viewed from above. In the case of arranging a plurality of bonding member 30 as described above, arranging them to have point symmetry about the center of the base 10 or line symmetry using the line connecting the centers of two opposing sides of the base 10 when viewed from above can increase the bonding quality between the base 10 and the light transmissive member 40. There is no particular restriction on the number and positions of the bonding members 30, as long as the gaps 70 secured after bonding the light transmissive member 40 and the base 10 are large enough to allow a gaseous raw material to be supplied to the space in which the light emitting element 20 is disposed during the process of forming a protective film 60 described below. In the example shown in FIG. 6, the bonding members 30 are arranged such that two pieces are present per side of the base 10. The bonding members 30 may be arranged such that one, three, or more pieces are present per side of the base 10. A bonding member 30 may be disposed in any position other than the four corners of the base 10, such as the center of a side of the base 10. A bonding member 30 may be disposed continuously over two or more sides. For example, one bonding member 30 can be disposed over three or four sides while leaving a gap at one location. In the case of disposing multiple bonding members 30, at least one bonding member 30 may be disposed over two or more sides of the base 10.

In the example shown in FIG. 6, one gap 70 is provided per side of the base 10. There may be a single gap 70, or multiple gaps 70 per side of the base 10. Two or more gaps 70 may be provided per side of the base 10. The height of a gap 70 (the thickness of the bonding member 30 between the second upper face 12a and the lower face 40b of the light transmissive member 40) can be set, for example, in a range of 1 μm to 100 μm. The height of a gap 70 is preferably set as 10 μm to 50 μm. In the case in which the first metal film 51 and the second metal film 52 described below are included, the height refers to the thickness of the bonding member 30 between the first metal film 51 and the second metal film 52. There is no particular restriction on the width of a gap 70, as long as it is large enough to allow a gaseous raw material to be supplied through the gap 70 into the space in which the light emitting element 20 is disposed in the process of forming a protective film 60 described below. The percentage of the width of the bonding member 30 (30W in FIG. 5) of the base 10 in the width of the second upper face 12a (12W in FIG. 5) in the direction perpendicular to the sides of the base 10 is preferably set, for example, as at least 50%. The width of the second upper face 12a in the direction perpendicular to the sides of the base 10 can be set, for example, in a range of 0.3 mm to 0.7 mm. The width of the bonding member 30 in the direction perpendicular to the sides of the base 10 can be set, for example, in a range of 0.2 mm to 0.5 mm.

On the second upper face 12a of the base 10, a first metal film 51 may be disposed or not. In the example shown in FIG. 6, the first metal film 51 is positioned between the bonding members 30 and the second upper face 12a of the base 10. The first metal film is quadrangular frame shaped when viewed from above, and the four corners are rounded. In the case in which a first metal film 51 is provided, the bonding members 30 are disposed on the first metal film 51.

Figure 7:
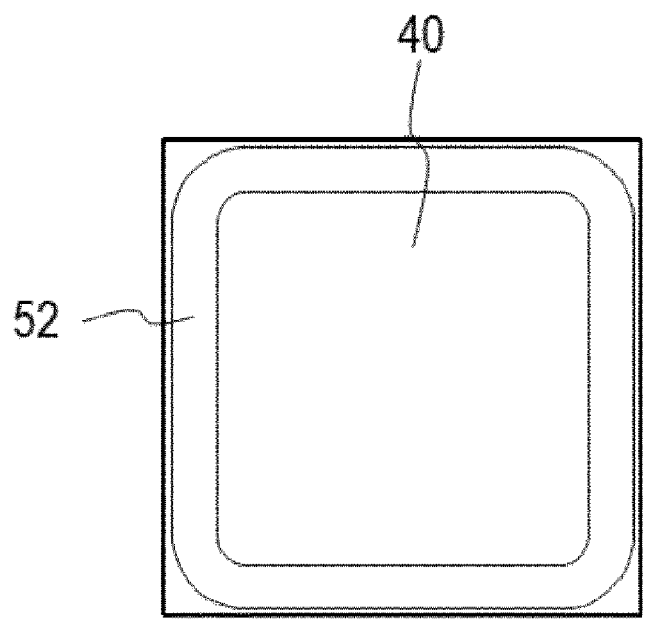
FIG. 7 is a schematic lower face view of a light transmissive member.

In the peripheral portion of the lower face 40b of the light transmissive member 40, a second metal film 52 may be disposed or not. In the example shown in FIG. 7, the second metal film 52 is disposed between the bonding members 30 and the lower face 40b of the light transmissive member 40. The second meal film 52 opposes the second upper face 12a of the base 10. The second metal film 52 is frame-shaped and has a quadrangular outline with arc-shaped chamfers (indentations) at the corners in a plan view of the lower face 40b of the light transmissive member 40. In the case in which a second metal film 52 is provided, the bonding members 30 are bonded to the second metal film 52.

A protective film 60 is made of an inorganic material and continuously covers the base 10, the light emitting element 20, the bonding members 30, and the light transmissive member 40. The protective film 60 in the example shown in FIG. 3 and FIG. 4 covers the lower face 10b excluding the surfaces of the second wires 15 and the outer lateral faces 10c of the base 10, the lateral faces 30c of the bonding members 30, and the surfaces of the light transmissive member 40, making up the lower face and the lateral faces in part and the upper face among the outer surfaces of the light emitting device 100. In the case in which a second recessed part 16 is provided, the protective film 60 preferably also covers the downward facing face 16b of the base 10 that defines the second recessed part 16. Furthermore, the protective film 60 covers the inner lateral faces 10d of the lateral wall part 12 and the first upper face 11a of the base part 11 of the base 10 that define the first recessed part of the base 10. Moreover, under the light emitting element 20, the protective film 60 covers the lower face of the light emitting element 20, the lateral faces of the conductive members, and the first upper face 11a of the base 10 positioned under the light emitting element 20. The protective film 60 preferably covers the light emitting element 20, the second upper face 12a of the base 10, the lateral faces 30c of the bonding members 30 interposed between the second upper face 12a of the base 10 and the lower face of the light transmissive member 40, and the lower face 40b of the light transmissive member 40 without any gap, such as an opening or break. In the light emitting device 100 shown in FIG. 3 and FIG. 4, the protective film 60 covers the surfaces of the base 10 excluding the surfaces of the second wires 15, the surfaces of the light emitting element 20, the lateral faces 30c of the bonding members 30, and the surfaces of the light transmissive member 40.

The light emitting device 100 may have a protective device, such as a Zener diode, or not. In the example shown in FIG. 6, a protective device 80 is disposed on the first upper face 11a of the base 10.

Each constituent element of the light emitting device 100 will be explained below.

Base 10

A base 10 is provided for mounting a light emitting element 20. In the example shown in FIG. 3, the base 10 has a flat sheet shaped base part 11 and a lateral wall part 12 disposed on the base part 11. A light emitting element 20 is disposed on the first upper face 11a of the base part 11, and bonding members 30 are disposed on the second upper face 12a of the lateral wall part 12. The shape of the first upper face 11a of the base part 11 defined by the lateral wall part 12 when viewed from above is, for example, quadrangular.

The base 10 includes an insulation base material, first wires 14, and second wires 15. Examples of the insulation base materials include ceramics, glass epoxy, and resins. For ceramics, a highly heat resistant and highly weather resistant material is preferably used. Examples of such ceramics include alumina, aluminum nitride, mullite and the like.

The first upper face 11a of the base 10 has first wires 14. The lower face 10b of the base 10 has second wires 15. The first wires 14 and the second wires 15 can be formed of any material known in the art. For the first wires 14 and the second wires 15, for example, a metal, such as copper, aluminum, gold, silver, or the like can be used.

Light Emitting Element 20

A light emitting element 20 is disposed on the first upper face 11a of the base part 11 of the base 10. For the light emitting element 20, a light emitting diode, laser diode, or the like can be used.

There is no particular restriction for the peak emission wavelength for the light emitting element 20, and any peak emission wavelength can be suitably selected, for example, 250 nm to 600 nm. For example, a light emitting diode that emits ultraviolet light can be used as a light source for sterilization or sanitization purposes. The peak emission wavelength for an ultraviolet light emitting element 20 is, for example, 400 nm at most. Because an ultraviolet light emitting element 20 tends to be readily degraded by moisture or the like, covering the element with a protective film 60 can notably improve the effect of reducing such degradation.

The light emitting element 20 is preferably made of nitride semiconductor layers, such as $In_XAl_YGa_{1-X-Y}N$ (0≤X, 0≤Y, X+Y≤1), for example. In the case of using a light emitting element that emits light in the deep ultraviolet to ultraviolet wavelength range, it preferably includes a nitride semiconductor layer containing at least Al. The light emitting element 20 includes semiconductor layers that include at least an emission layer, and positive and negative electrodes. In the light emitting element 20 according to this embodiment, the positive and negative electrodes are disposed on the same face. Accordingly, the light emitting element 20 can be flip-chip mounted on the base 10, thereby reducing the size of the light emitting device 100 as compared to the case in which the light emitting element 20 and the base 10 are electrically connected using wires. The face of the light emitting element that is opposite the face having the electrodes can be bonded to the first upper face 11a of the base 10 while electrically connecting the positive and negative electrodes of the light emitting element 20 to the positive and negative first wires 14 using wires, respectively. Alternatively, a light emitting element having one of the positive and negative electrodes on the upper face and the other electrode on the lower face can be used.

The light emitting element 20 can have a substrate for growing a semiconductor layer in addition to the semiconductor layers and the electrodes described above. Examples of such a substrate include an insulating substrate, such as sapphire, lithium niobate, or neodymium gallate, or a conductive substrate, such as SiC, ZnO, Si, GaAs, or the like.

The substrate preferably has light transmissivity. The substrate may be removed by utilizing a laser lift-off technique or the like.

In the example shown in FIG. 6, the light emitting element 20 is disposed in the center of the first upper face 11a. In the example shown in FIG. 6, moreover, the light emitting device 100 has one light emitting element 20. The light emitting device 100 may have multiple light emitting elements 20 arranged therein. The light emitting element 20 in a top view can have a quadrangular shape, for example. In this case, the length of a side of the light emitting element 20 when viewed from above is preferably in a range of 50 μm to 3,000 μm, for example, more preferably 300 μm to 2,000 μm. The top view shape of the light emitting element 20 may be another polygon, such as a triangle, hexagon, or the like.

Bonding Member 30

A bonding member 30 bonds the base 10 and the light transmissive member 40. The bonding member 30, in the case in which the light emitting device 100 includes a first metal film 51 and a second metal film 52, is disposed between the first metal film 51 and the second metal film 52. Examples of the bonding member 30 include solder, low melting point glass, resins, and the like. Examples of solder include Au—Sn, Au—In, and the like. Examples of resins include silicone resins, epoxy resins, and the like.

Figure 8:
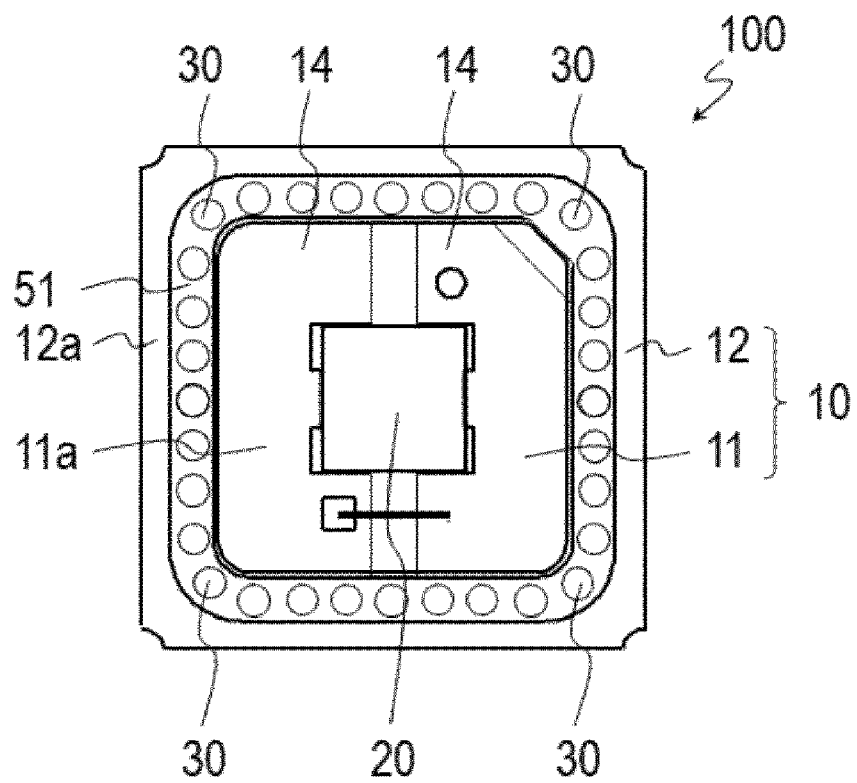
FIG. 8 is a schematic upper face view showing another layout of bonding members 30.

FIG. 8 is a schematic top view showing another layout of the bonding members 30. In the example shown in FIG. 8, multiple bonding members 30 are annularly arranged at certain intervals. The bonding members 30 are arranged in the regions excluding the four corners of the base 10. In the example shown in FIG. 8, three or more bonding members 30 are arranged per side of the base 10. This can increase the bonding strength between the base 10 and the light transmissive member 40.

Light Transmissive Member 40

A light transmissive member 40 has the function of transmitting the light from the light emitting element 20 disposed on the base 10 to be output from the light emitting device 100. The light transmissive member 40 preferably transmits at least 60%, more preferably at least 90% of the emitted light from the light emitting element 20. Examples of materials for use as the light transmissive member 40 include an inorganic material made of at least one selected from the group consisting of sapphire, borosilicate glass, quartz glass, calcium fluoride glass, aluminoborosilicate glass, oxynitride glass, and chalcogenide glass. The thickness of the light transmissive member 40 may be, for example, in a range of 0.1 mm to 7 mm.

Protective Film 60

A protective film 60 has the function of protecting the light emitting element, the base, and the bonding members from dust and moisture. The protective film 60 has light transmissivity and insulation properties, and as shown in FIG. 2, continuously covers at least the light emitting element 20, the upper face 10a of the base 10, and the lateral faces of the bonding members 30. As shown in FIG. 2, the protective film 60 preferably covers substantially all surfaces of the light emitting device 100 except for the lower face. This can reduce the chance of allowing the protective film 60 to be separated from the surfaces of the light emitting device 100.

Examples of materials for the protective film 60 include inorganic materials, such as aluminum oxide, silicon dioxide, tantalum oxide, niobium oxide, titanium oxide, aluminum nitride, silicon nitride, and the like. The protective film 60 preferably is a film that contains aluminum oxide or silicon dioxide as a primary component. The protective film 60 can be of a single layer film of one material, or a multilayer film made of two or more different materials. Specifically, it is preferable to use a stack composed of a layer made of aluminum oxide as a primary component and a layer made of silicon dioxide as a primary component, or a stack in which these layers are repeatedly alternately stacked. The thickness of the protective film 60 is, for example, in a range of 3 nm to 250 nm. The thickness of the protective film 60 is preferably in a range of 40 nm to 150 nm. In the case of employing a multilayer film for the protective film 60, the total thickness of all layers is preferably set to fall within the ranges described above.

The light emitting device 100 according to this embodiment is such that the light emitting element 20, the base 10, and the lateral faces of the bonding members 30 are continuously covered by the protective film 60 to protect these members from the external factors, such as dust and moisture. Thus, deterioration attributable to oxidation or the like can be prevented. Accordingly, a highly reliable light emitting device 100 can be provided.

Method of Manufacturing Light Emitting Device 100

Figure 9A:
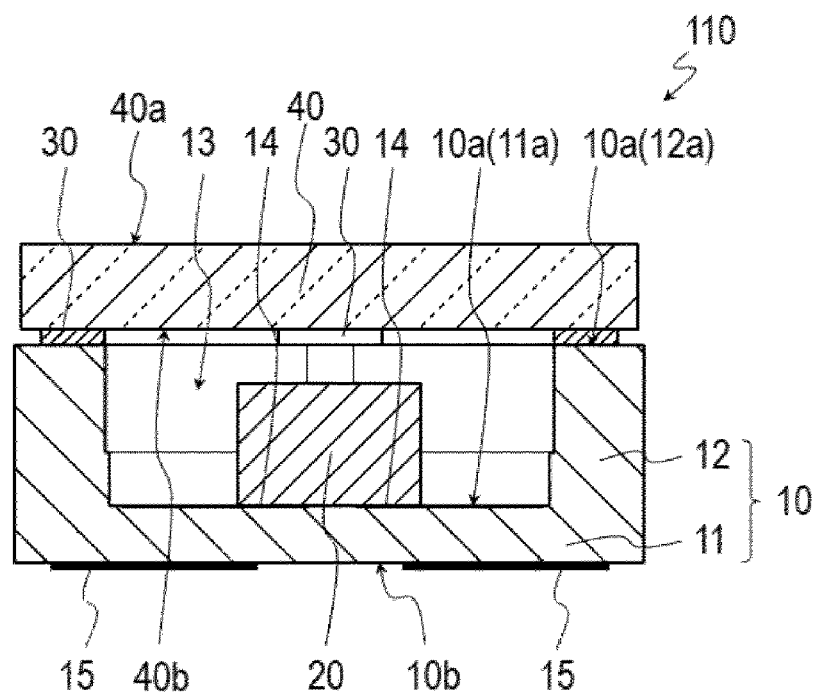
FIG. 9A is a schematic cross-sectional view explaining a method of manufacturing a light emitting device according to Embodiment 1.
Figure 9B:
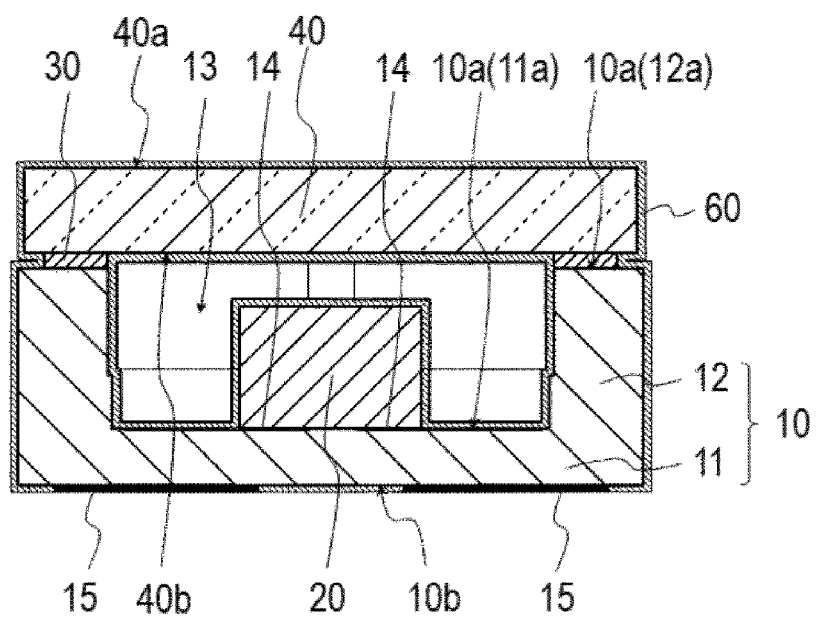
FIG. 9B is a schematic cross-sectional view explaining a method of manufacturing a light emitting device according to Embodiment 1.

FIG. 9A and FIG. 9B are schematic cross-sectional views explaining a method of manufacturing a light emitting device 100 of Embodiment 1.

Process of Preparing Intermediate Body 110

As shown in FIG. 9A, an intermediate body 110, which includes a base 10 having an upper face 10a, a light emitting element 20 mounted on the upper face 10a, a bonding member 30 disposed on the upper face 10a outward of the light emitting element 20, and a light transmissive member 40 bonded to a portion of the upper face 10a by the bonding member 30, is prepared. The intermediate body 110 has, between the upper face 10a of the base 10 and the lower face 40b of the light transmissive member 40, a gap 70 that allows the space in which the light emitting element 20 is mounted to be in communication with the outside of the intermediate body 110. The gap 70 is created by the bonding member 30 interposed between the upper face 10a of the base 10 and the lower face 40b of the light transmissive member 40.

One example of the method of manufacturing such an intermediate body 110 will be explained. First, a light emitting element 20 is mounted on the first upper face 11a of the base 10. A bonding member 30 is disposed on a portion of the second upper face 12a outward of the light emitting element 20. Subsequently, by bonding the portion of the second upper face 12a and the light transmissive member 40 using the bonding member 30, an intermediate body 110 like that shown in FIG. 9A is obtained. Such an intermediate body 110 may be purchased, or prepared by following the intermediate body preparation process in part or whole.

Process of Forming Protective Film 60

Next, as shown in FIG. 9B, a protective film 60 that covers the upper face 10a of the base 10 and the light emitting element 20 is formed.

The protective film 60 is preferably formed by atomic layer deposition (ALD). Forming the protective film 60 by atomic layer deposition can thinly form a dense protective film 60 across all surfaces that extend in different planar directions. Employing atomic layer deposition allows the gaseous raw material for forming the protective film 60 to be supplied through the gap created between the upper face 10a of the base 10 and the lower face 40b of the light transmissive member 40.

The protective film 60 can be formed to continuously cover at least the upper face 10a of the base 10, the light emitting element 20, and the lateral faces of the bonding member 30, but is preferably formed to substantially cover all surfaces of the light emitting device excluding the second wires 15 as shown in FIG. 9B. Examples of methods of selectively forming the protective film 60 as described above include one that forms a protective film 60 on all surfaces of the light emitting device 100 followed by removing the protective film 60 positioned on the second wires 15 by grinding or laser beam irradiation, one that uses a mask to cover the second wires 15 before forming a protective film 60, and the like.

Embodiment 2

Figure 10:
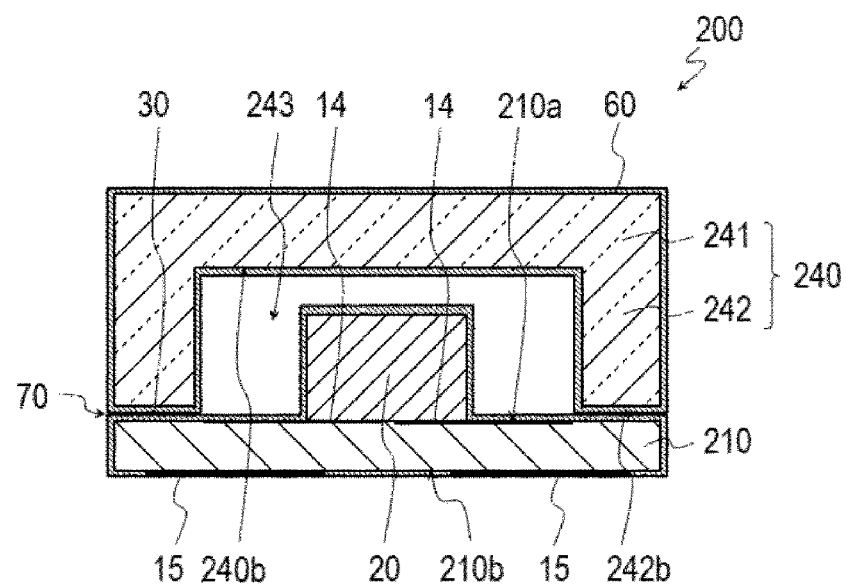
FIG. 10 is a schematic end face view showing only a cross section of a light emitting device according to Embodiment 2.

FIG. 10 is a schematic end face view showing only a cross section of a light emitting device 200 according to Embodiment 2.

The light emitting device 200 has a light emitting element 20 and a light transmissive member 240 on a flat sheet shaped base 210. The light transmissive member 240 has a flat sheet part 241, and a lateral wall part 242 positioned under the flat sheet part 241. The lower face 242b of the lateral wall part 242 is bonded to the base 210 via a bonding member 30. The flat sheet part 241 and the lateral wall part 242 of the light transmissive member 240 can be formed integrally. A light emitting element is positioned in the recessed part 243 defined by the flat sheet part 241 and the lateral wall part 242. The shape of the opening of the recessed part 243 is, for example, quadrangular. A gap 70 that allows the space in which the light emitting element 20 is mounted to be in communication with the outside of the light emitting device 100 is present between the base 210 and the lower face 242b of the light transmissive member 240. The gap 70 is defined by the upper face 10a of the base 10, the lower face 240b of the light transmissive member 240, and the bonding member 30. The protective film 60 covers the surfaces of the base 210, the surfaces of the light emitting element 20, the lateral faces of the bonding member 30, and the surfaces of the light transmissive member. In the light emitting device 200 shown in FIG. 10, the light emitting element 20, the base 210, and the lateral faces of the bonding member 30, which are continuously covered by the protective film 60, can be protected from dust and moisture to thereby prevent the deterioration attributable to oxidation and the like.

What is claimed is:

1. A light emitting device comprising:
   a base having an upper face;
   a light emitting element mounted on the upper face of the base;
   one or more bonding members disposed on the upper face of the base outward of the light emitting element;
   a light transmissive member bonded to a portion of the upper face of the base by the one or more bonding members; and
   a protective film that continuously covers the light emitting element, the upper face of the base, lateral faces of the one or more bonding members, and a lower face of the light transmissive member; wherein:
   a gap is located between the upper face of the base and the lower face of the light transmissive member and configured to allow a space in which the light emitting element is mounted to communicate with an outside of the light emitting device, wherein the gap is defined by the upper face of the base, the lower face of the light transmissive member, and the one or more bonding members.

2. The light emitting device according to claim 1, wherein the one or more bonding members comprise a plurality of bonding members.

3. The light emitting device according to claim 1, further comprising a first metal film between the one or more bonding members and the upper face of the base, wherein the protective film continuously covers the one or more bonding members, the first metal film, and the base.

4. The light emitting device according to claim 1, further comprising a second metal film between the one or more bonding members and the lower face of the light transmissive member, wherein the protective film continuously covers the one or more bonding members, the second metal film, and the lower face of the light transmissive member.

5. The light emitting device according to claim 1, wherein:
   the base has a flat sheet shaped base part and a lateral wall part disposed on the base part, the base part and the lateral wall part defining a recessed part;
   the light emitting element is disposed in the recessed part; and
   the protective film covers inner lateral faces of the lateral wall part and an upper face of the base part that define the recessed part.

6. The light emitting device according to claim 1, wherein the protective film is made of an inorganic material.

7. The light emitting device according to claim 1, wherein the protective film is a multilayer film.

* * * * *